United States Patent
Zyuban et al.

(10) Patent No.: US 12,395,174 B1
(45) Date of Patent: Aug. 19, 2025

(54) CLOCK-FREE SERIALIZATION OF ASYNCHRONOUS SIGNALS

(71) Applicant: Apple Inc., Cupertino, CA (US)

(72) Inventors: Victor Zyuban, Sunnyvale, CA (US); Hemangi U. Gajjewar, Sunnyvale, CA (US); Ajay Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 110 days.

(21) Appl. No.: 18/534,500

(22) Filed: Dec. 8, 2023

Related U.S. Application Data

(60) Provisional application No. 63/581,233, filed on Sep. 7, 2023.

(51) Int. Cl.
| | |
|---|---|
| *H03K 5/00* | (2006.01) |
| *H03K 3/037* | (2006.01) |
| *H03K 5/01* | (2006.01) |
| *H03K 19/00* | (2006.01) |
| *H03K 19/21* | (2006.01) |

(52) U.S. Cl.
CPC ......... *H03K 19/0008* (2013.01); *H03K 3/037* (2013.01); *H03K 5/01* (2013.01); *H03K 19/21* (2013.01); *H03K 2005/00013* (2013.01)

(58) Field of Classification Search
CPC ...... G06F 1/12; H03K 19/0008; H03K 3/037; H03K 5/01; H03K 19/21; H03K 2005/00013
See application file for complete search history.

(56) References Cited

U.S. PATENT DOCUMENTS

| | | | | |
|---|---|---|---|---|
| 4,167,789 | A | * | 9/1979 | Faustini ............... G11C 11/5621 713/600 |
| 4,980,577 | A | * | 12/1990 | Baxter ................... H03K 3/037 327/19 |
| 5,388,225 | A | | 2/1995 | Cantrell et al. |
| 5,410,550 | A | | 4/1995 | Simmons et al. |
| 6,078,193 | A | * | 6/2000 | Bazuin ............... H03K 19/0016 326/96 |
| 6,140,946 | A | | 10/2000 | Desrosiers et al. |
| 6,958,627 | B2 | | 10/2005 | Singh et al. |
| 7,031,421 | B2 | | 4/2006 | Marx et al. |
| 2004/0095170 | A1 | * | 5/2004 | Sugimoto ................ H04L 7/02 327/141 |

(Continued)

*Primary Examiner* — Tuan T Lam
(74) *Attorney, Agent, or Firm* — DICKINSON WRIGHT RLLP

(57) ABSTRACT

A serializer circuit for a computer system is disclosed. The serializer circuit may receive multiple asynchronous signals, and generate a particular serialized signal by blocking transitions of a particular asynchronous signal that corresponds to the particular serialized signal in response to a detection of a transition of at least one of the remaining asynchronous signals that does not include the particular asynchronous signal. The serializer circuit may also generate a different serialized signal by blocking transitions of a different asynchronous signal that corresponds to the different serialized signal in response to a detection of a transition of at least one of the remaining asynchronous signals that does not include the different asynchronous signal. A digital circuit may generate a particular output signal using the particular serialized signal, and generate a different output signal using the different serialized signal.

20 Claims, 12 Drawing Sheets

(56) References Cited

U.S. PATENT DOCUMENTS

2009/0267660 A1* 10/2009 Milton .................... H04L 7/033
                                                                    327/145
2023/0327657 A1* 10/2023 Undheim .................. H03L 7/08
                                                                    327/153

* cited by examiner

CLOCK-FREE SERIALIZATION OF ASYNCHRONOUS SIGNALS

CROSS-REFERENCE TO RELATED APPLICATIONS

The present application claims the benefit of U.S. Provisional Application No. 63/581,233, entitled "CLOCK-FREE SERIALIZATION OF ASYNCHRONOUS SIGNALS," filed Sep. 7, 2023, the content of which is incorporated by reference herein in its entirety for all purposes.

FIELD

The described embodiments relate generally to integrated circuits, and more particularly, to techniques for serializing asynchronous inputs to a circuit block.

BACKGROUND

Modern computer systems may include multiple circuit blocks designed to perform various functions. For example, such circuit blocks may include processors or processor cores configured to execute software or program instructions. Additionally, the circuit blocks may include memory circuits, mixed-signal circuits, analog circuits, and the like.

In some computer systems, the circuit blocks may transfer control information and/or data between themselves. In some cases, signals encoding such control information or data are transferred between the blocks in a synchronous fashion, where transitions of the signals are limited to particular times specified by a timing or clock signal. In other cases, the signals encoding the control information or data can be transferred between circuit blocks in an asynchronous fashion, where there are no constraints as to when transitions of different ones of the signals can occur relative to each other.

DETAILED DESCRIPTION

Figure 1:
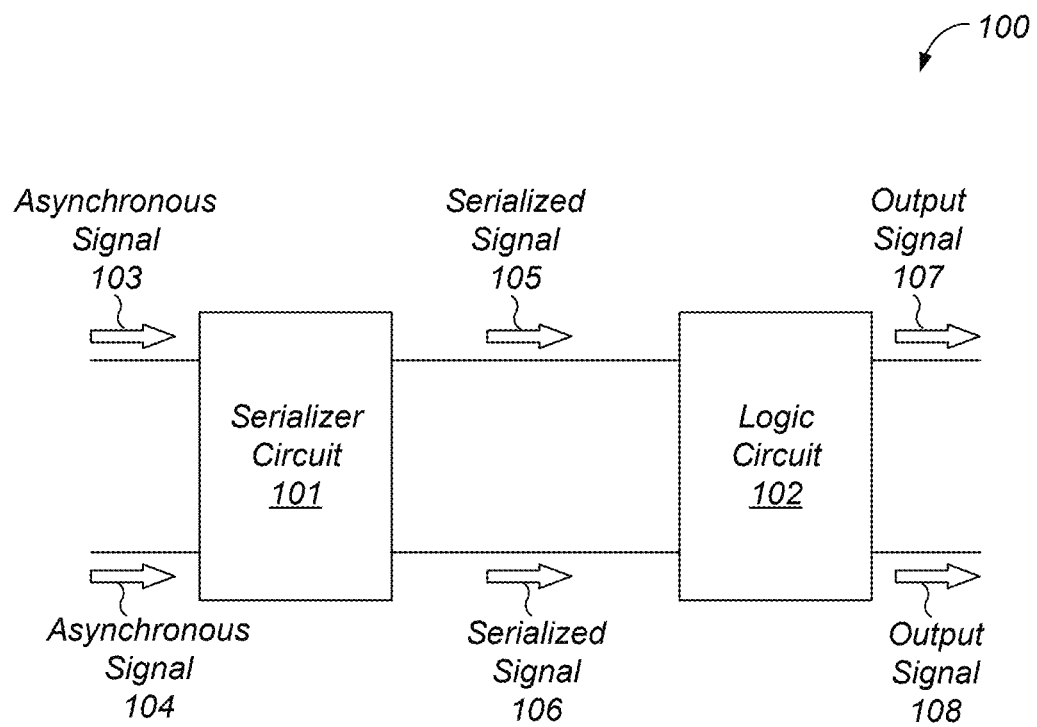
FIG. 1 is a block diagram depicting an embodiment of a serialization subsystem for a computer system.

Computer systems may include multiple circuit blocks configured to perform specific functions. In some cases, certain circuit blocks need to exchange signals during operation of a computer system. Such signals may encode control and/or data information.

In some computer systems, a particular circuit block may receive multiple signals from different circuit blocks. The received signals may be asynchronous to each other, i.e., transitions of one signal from one logic value to another logic value can occur at any time relative to transitions of the other signals.

When two or more signals at the inputs of a circuit block transition within a particular time window, asynchronous transitions can occur inside the circuit block. Such asynchronous transitions may cause race conditions in the circuit block and/or unpredictable behavior of the circuit block, potentially leading to error or potentially putting the circuit into an undefined or unverified state.

To avoid such problems, asynchronous signals are often synchronized to a common clock signal, such that all signals internal to a receiving circuit block are derived from flip-flop or latch circuits that sample the asynchronous signal under control of the common clock signal, which needs to be running during the time periods when the asynchronous signals are transitioning. The power associated with such a clock signal, both in the generation of the signal and the switching of the load of the clock signal, can exceed desired limits for low-power applications. In some cases, e.g., a system-on-a-chip ("SoC"), power is reduced through clock gating, where clock signals in the SoC are deactivated.

The embodiments illustrated in the drawings and described below provide techniques for serializing transitions of asynchronous input signals to a circuit block without using a clock signal. By using the asynchronous signals themselves, along with outputs of the circuit block, latch circuits can be operated to block transitions for a period of time in order to provide signals to the circuit block that are adequately separated in time to avoid race conditions or unpredictable behavior in the circuit block. In some cases, performing the serialization without a timing or clock signal can provide reduced power consumption.

A block diagram of a serialization subsystem for a computer system is depicted in FIG. 1. As illustrated, serialization subsystem 100 includes serializer circuit 101 and logic circuit 102.

Serializer circuit 101 is configured to receive asynchronous signal 103 and asynchronous signal 104. As used herein, an asynchronous signal is a signal whose transitions between logic values are not limited to times specified by a timing or clock signal, and can occur at any time relative to another asynchronous signal. In various embodiments, asynchronous signals 103 and 104 may be from different circuit blocks or be part of an asynchronous data bus.

In various embodiments, serializer circuit 101 is further configured to generate serialized signal 105 by blocking transitions of asynchronous signal 103 in response to a detection of a transition of asynchronous signal 104. Serializer circuit 101 is also configured to generate serialized signal 106 by blocking transitions of asynchronous signal 104 in response to a detection of a transition of asynchronous signal 103.

Logic circuit 102 is configured to generate output signal 107 using serialized signal 105. Additionally, logic circuit 102 is configured to generate output signal 108 using serialized signal 106. As described below, logic circuit 102 may include multiple logic sub-circuits coupled together in a serial fashion.

As described below, to block the transitions of asynchronous signal 103 from propagating to serialized signal 105, serializer circuit 101 can be further configured to transition a latch circuit from a transparent mode to an opaque mode using a combination of asynchronous signal 104 and a delayed version of asynchronous signal 104. In some case, the delayed version of asynchronous signal 104 may be generated using a delay circuit configured to generate a delay corresponding to a time needed for a transition of asynchronous signal 104 to generate a corresponding transition on output signal 108. In some cases, rather than using the delayed version of asynchronous signal 104, output signal 108 can be used instead. A similar technique is used to block transitions of asynchronous signals 104 from propagating to serialized signal 106. It is noted that by using asynchronous signals 103 and 104 and signals derived from asynchronous signals 103 and 104, serialized signals 105 and 106 can be generated without the use of a timing or clock signal, thereby reducing power consumption.

By selectively blocking transitions of one of asynchronous signals 103 and 104, the transitions from one logic value to another of asynchronous signals 103 and 104 can be rearranged on serialized signals 105 and 106 in a serial fashion with adequate time between transitions to reduce the risk of race condition or other unpredictable behavior in logic circuit 102.

Figure 2:
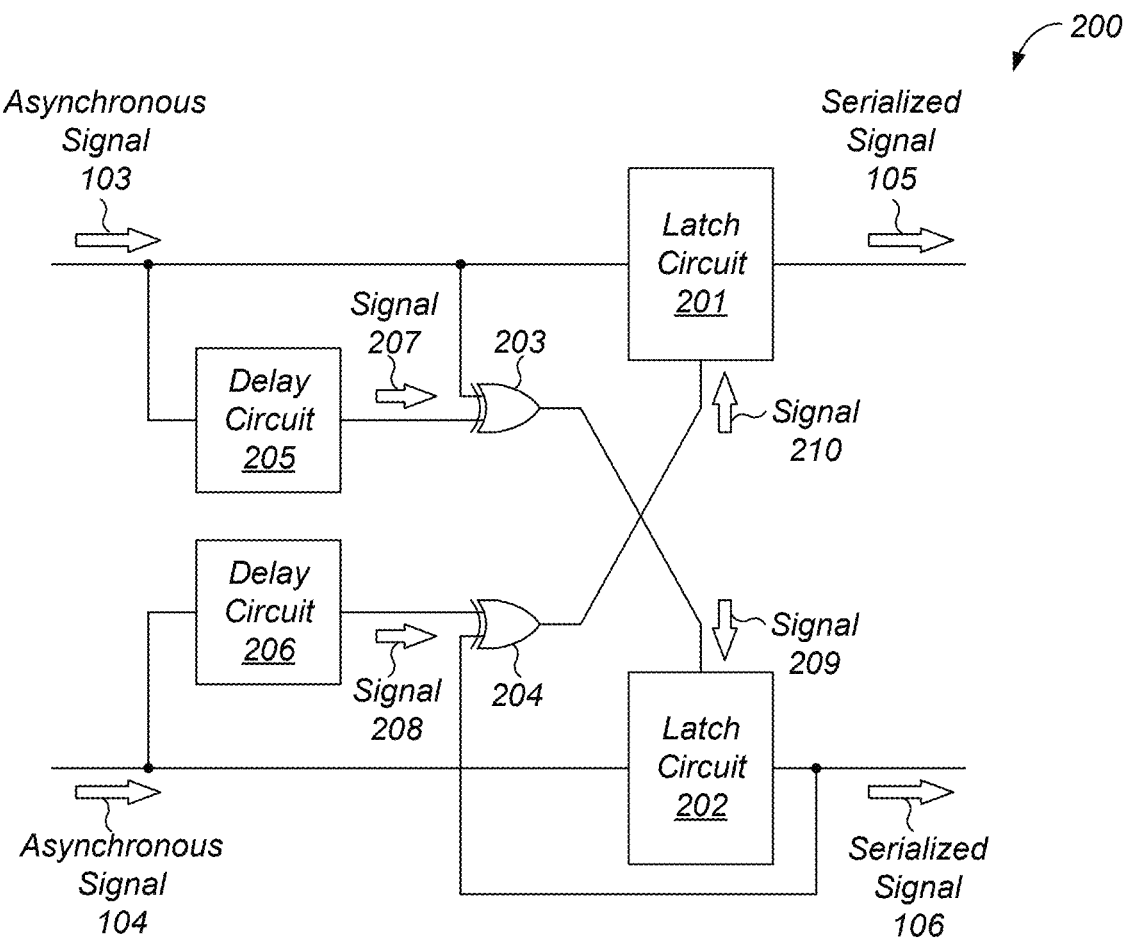
FIG. 2 is a block diagram depicting an embodiment of a serializer circuit.

Turning to FIG. 2, a block diagram of an embodiment of a serializer circuit is depicted. As illustrated, serializer circuit 200 includes latch circuit 201, latch circuit 202, logic gates 203 and 204, and delay circuits 205 and 206. In various embodiments, serializer circuit 200 may correspond to serializer circuit 101 as depicted in FIG. 1. It is noted that although only two asynchronous signals are depicted in the embodiment of FIG. 2, in other embodiments, similar techniques to those described below in regard to FIG. 2 may be employed to implement serializer circuits that can serialize more than two asynchronous signals.

Latch circuit 201 is configured to sample, in response to an activation of signal 210, a value of asynchronous signal 103 to generate serialized signal 105. In a similar fashion, latch circuit 202 is configured to sample, in response to an activation of signal 209, asynchronous signal 104 to generate serialized signal 106. While signals 209 and 210 are activated, latch circuits 201 and 202 are configured to maintain serialized signals 105 and 106 at their respective sampled values of asynchronous signals 103 and 104. During this time, transitions on asynchronous signals 103 and 104 are prevented (also referred to as "blocked") from inducing corresponding transitions on serialized signals 105 and 106. When signals 209 and 210 are deactivated, latch circuits 201 and 202 are configured to change from an opaque state to a transparent state, allowing transitions on asynchronous signals 103 and 104 to propagate to serialized signals 105 and 106, respectively.

As used herein, the activation of a signal refers to transitioning the signal to a logic value that causes a circuit to perform a particular operation. The activation level of a given signal may be either a logic-1 value (referred to as an "active high" signal) or a logic-0 value (referred to as an "active low" signal). Voltage levels associated with the different logic levels may depend on a type of technology used to implement a circuit. For example, in complementary metal-oxide semiconductor ("CMOS") technology, a logic-1 value may correspond to a voltage level sufficient to activate an n-channel metal-oxide semiconductor field-effect transistor ("MOSFET"), Fin field-effect transistor ("FinFET"), a gate-all-around field-effect transistor ("GAAFET"), and the like, while a logic-0 may correspond to a voltage level sufficient to activate a p-channel MOSFET, FinFET, GAAFET, and the like.

In various embodiments, latch circuits 201 and 202 may be implemented using any suitable combination of logic gates (e.g., NAND gates, NOR gates, and the like). Alternatively, or additionally, latch circuits 201 and 202 may be implemented using any suitable combination of MOSFETs, FinFETs, GAAFETs, or any other suitable transconductance devices.

Delay circuit 205 is configured to generate signal 207 using asynchronous signal 103, and delay circuit 206 is configured to generate signal 208 using asynchronous signal 104. In various embodiments, signals 207 and 208 are delayed versions of asynchronous signals 103 and 104, respectively. In other words, a transition on either of asynchronous signals 103 or 104 results in a corresponding transition on signals 207 or 208, respectively, after a predetermined time period has elapsed. In some embodiments, the predetermined time period is generated by delay circuits 205 and 206, and may, in some embodiments, be programmable or otherwise adjustable to compensate for changes in temperature, power supply voltage levels, manufacturing variation, and the like.

Logic gate 203 is configured to generate signal 209 using signal 207 and asynchronous signal 103, while logic gate 204 is configured to generate signal 210 using signal 208 and serialized signal 106. In various embodiments, logic gate 203 is configured to activate signal 209 in response to a determination that asynchronous signal 103 and signal 207 are both active. Likewise, logic gate 204 may be configured to activate signal 210 in response to a determination that serialized signal 106 and signal 208 have different logic levels, i.e., signal 106 has transitioned from old to new logic level, whereas the delayed signal 208 has not yet transitioned. It is noted that the asymmetry in the connections for logic gates 203 and 204 is to avoid glitches in serialized signals 105 and 106 and/or to avoid a serializer circuit 200 entering a metastable state when asynchronous signals 103 and 104 both switch within a short period of time of each other. In cases where such glitches and metastability are not a concern, logic gate 204 can use signal 208 and asynchronous signal 104 to generate signal 210.

In various embodiments, logic gates 203 and 204 may be configured to perform an exclusive-OR operation to generate signals 209 and 210, respectively. Logic gates 203 and 204 may be implemented using any suitable combination of transistors and combinatorial logic gates configured to implement the exclusive-OR logic function.

Figure 3:
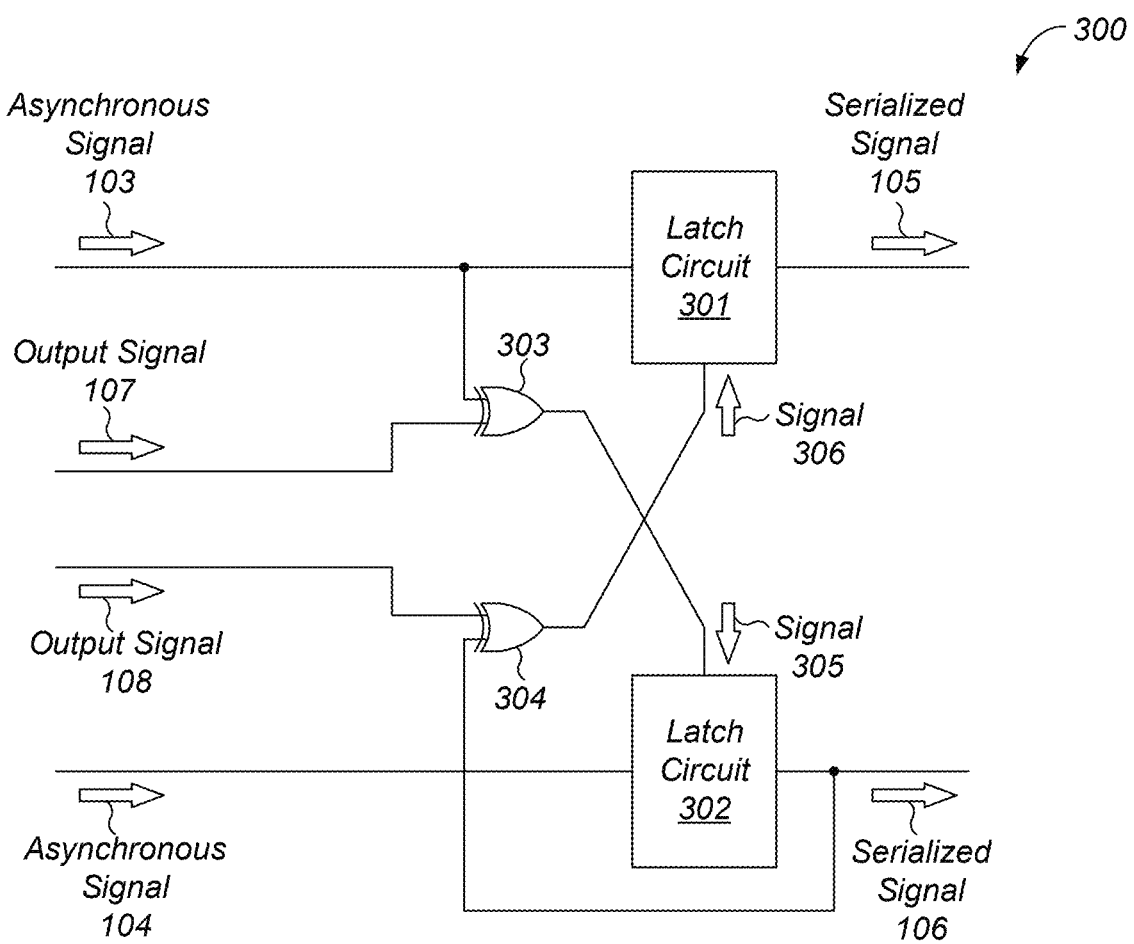
FIG. 3 is a block diagram depicting a different embodiment of a serializer circuit.

Turning to FIG. 3, a block diagram of another embodiment of a serializer circuit is depicted. As illustrated, serializer circuit 300 includes latch circuits 301 and 302, and logic gates 303 and 304. In various embodiments, serializer circuit 300 may correspond to serializer circuit 101 as depicted in FIG. 1. It is noted that although only two asynchronous signals are depicted in the embodiment of FIG. 3, in other embodiments, similar techniques to those described below in regard to FIG. 3 may be employed to implement serializer circuits to serialize more than two asynchronous signals.

Logic gate 303 is configured to generate signal 305 using asynchronous signal 103 and output signal 107. In a similar fashion, logic gate 304 is configured to generate signal 306 using serialized signal 106 and output signal 108. In various embodiments, logic gate 303 is configured to activate signal 305 in response to a determination that both asynchronous signal 103 and output signal 107 are both active. Likewise, logic gate 304 may be configured to activate signal 306 in response to a determination that serialized signal 106 and output signal 108 have different logic levels, i.e., signal 106 has transitioned from old to new logic level, whereas the delayed signal 208 has not yet transitioned. It is noted that the asymmetry in the connections for logic gates 303 and 304 is to avoid glitches in serialized signals 105 and 106 and/or to avoid a serializer circuit 300 entering a metastable state when asynchronous signals 103 and 104 both switch within a short period of time of each other. In cases where such glitches and metastability are not a concern, logic gate 304 can use signal 208 and asynchronous signal 104 to generate signal 306.

In various embodiments, logic gates 303 and 304 are configured to perform an exclusive-OR operation to generate signals 305 and 306, respectively. Logic gates 303 and 304 may be implemented using any suitable combination of transistors and combinatorial logic gates configured to implement the exclusive-OR function.

Latch circuit 301 is configured to sample, in response to an activation of signal 306, a value of asynchronous signal 103 to generate serialized signal 105. In a similar fashion, latch circuit 302 is configured to sample, in response to an activation of signal 305, a value of asynchronous signal 104 to generate serialized signal 106. While signals 306 and 305 are activated, latch circuits 301 and 302 are configured to maintain serialized signals 105 and 106 at their respective sampled values of asynchronous signals 103 and 104. During this time, transitions of asynchronous signals 103 and 104 are blocked from inducing corresponding transitions on serialized signals 105 and 106. When signals 306 and 305 are deactivated, latch circuits 301 and 302 are configured to change from an opaque state to a transparent state, allowing transitions on asynchronous signals 103 and 104 to propagate to serialized signals 105 and 106, respectively.

In various embodiments, latch circuits 301 and 302 may be implemented using any suitable combination of logic gates (e.g., NAND gates, NOR gates, and the like). Alternatively, or additionally, latch circuits 301 and 302 may be implemented using any suitable combination of MOSFETs, FinFETs, GAAFETs, or any other suitable transconductance devices.

Figure 4:
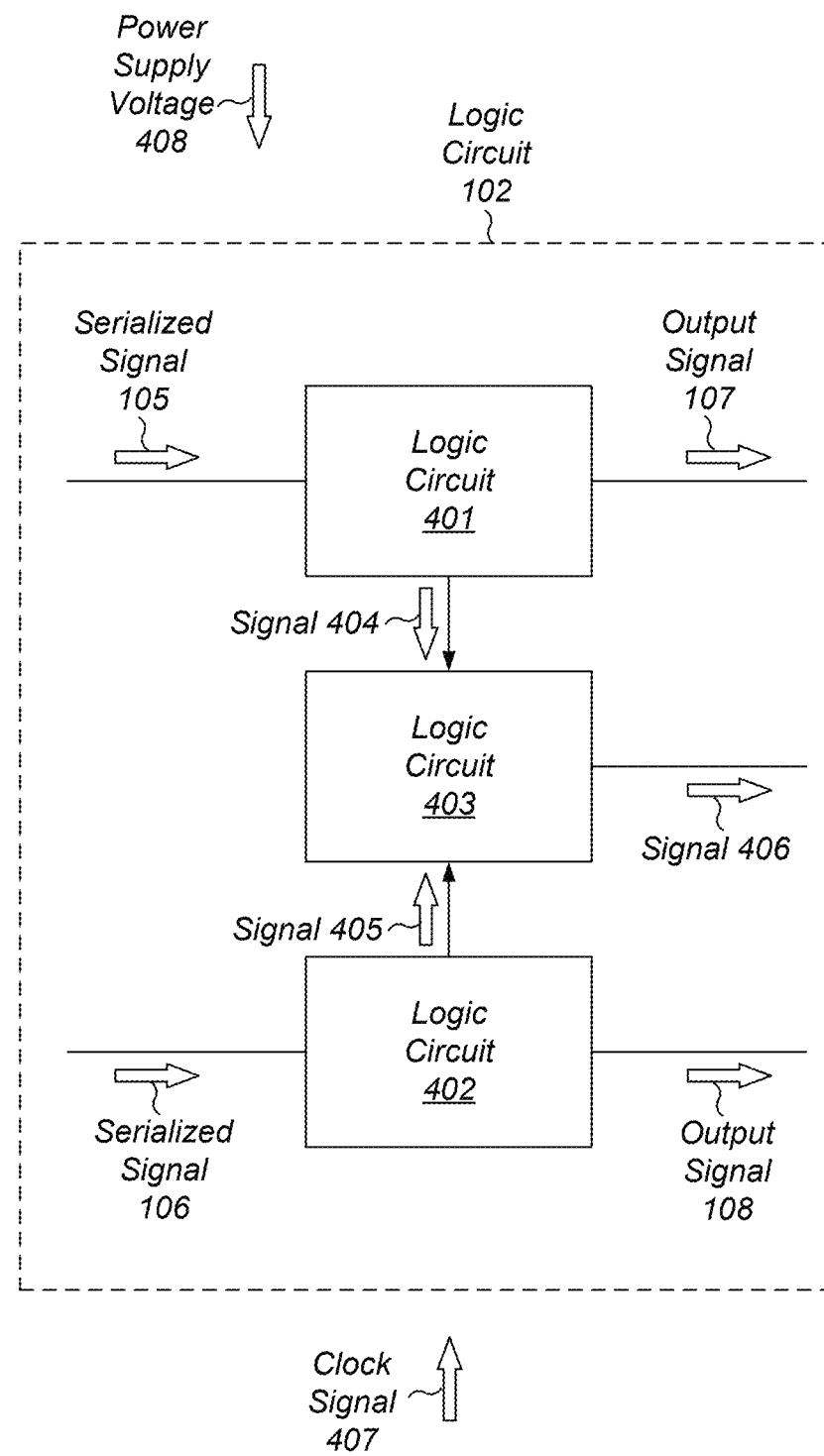
FIG. 4 is a block diagram depicting an embodiment of a logic circuit for a serialization subsystem.

Turning to FIG. 4, a block diagram of an embodiment of logic circuit 102 is depicted. As illustrated, logic circuit 102 includes logic circuits 401-403. Although only three logic circuits are depicted in the embodiment of FIG. 4, in other embodiments, any suitable number of logic circuits may be employed.

Logic circuit 401 is configured to generate output signal 107 using serialized signal 105. In a similar fashion, logic circuit 402 is configured to generate output signal 108 using serialized signal 106. Additionally, logic circuit 401 is configured to generate signal 404 using serialized signal 105, while logic circuit 402 is configured to generate signal 405 using serialized signal 106. Logic circuit 403 is configured to generate signal 406 using signals 404 and 405. It is noted that logic circuit 403 does not make use of serialized signals 105 and 106.

In various embodiments, logic circuits 401-403 may be implemented using any suitable combination of combinatorial and sequential logic circuits. In some embodiments, sequential logic circuits included in logic circuits 401-403 may be configured to transition between logic states using clock signal 407. Logic circuits 401-403 may be further configured to use power supply voltage 408 to generate their respective output signals. As described below, a value of power supply voltage 408 and a frequency of clock signal 407 may be adjusted as part of a change in power state to vary a performance level of logic circuit 102.

It is noted that the depiction of logic circuits 401-403 as separate physical entities is for clarity and that, in various embodiments, different portions of logic circuits 401-403 may be physically located next to other portions of logic circuits 401-403. For example, a portion of logic circuit 401 may be physically located on an integrated circuit amidst various portions of logic circuit 402.

Figure 5:
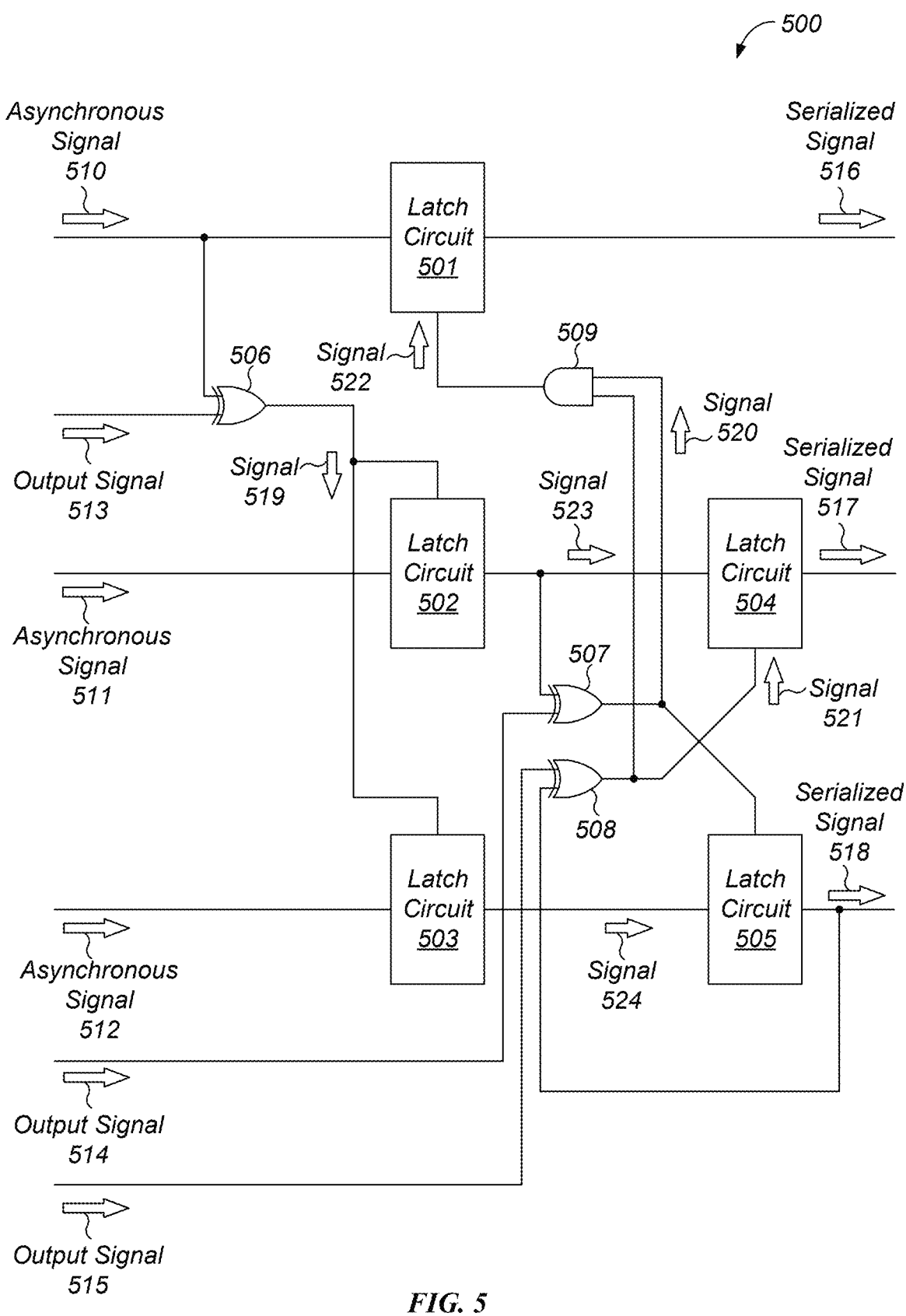
FIG. 5 is a block diagram depicting another embodiment of a serializer circuit.

As previously described, it is possible to extend the concepts described in regards to the embodiments of FIGS. 2 and 3 to allow for the serialization of more than two asynchronous signals. A block diagram of an embodiment of a serializer circuit configured to serialize three asynchronous signals is depicted in FIG. 5. As illustrated, serializer circuit 500 includes latch circuits 501-505 and logic gates 506-509. It is noted that output signal 513 corresponds with asynchronous signal 510, and output signal 514 corresponds to asynchronous signals 511. Output signal 515 corresponds to asynchronous signals 512.

Logic gate 506 is configured to generate signal 519 using asynchronous signal 510 and output signal 513. In various embodiments, logic gate 506 may be further configured to activate signal 519 in response to a determination that asynchronous signal 510 and output signal 513 have the same logic value.

In response to an activation of signal 519, latch circuits 502 and 503 are configured to transition to an opaque mode, blocking transitions of asynchronous signals 511 and 512 from propagating to signals 523 and 524, respectively. Latch circuits 502 and 503 are further configured, in response to a deactivation of signal 519, to transition to a transparent mode allowing transitions of asynchronous signals 511 and 512 to propagate to signals 523 and 524, respectively.

Logic gate 507 is configured to generate signal 520 using signal 523 and output signal 514. To generate signal 520, logic gate 507 is further configured to activate signal 520 in response to a determination that signal 523 and output signal 514 have the same logic value.

In response to the activation of signal 520, latch circuit 505 is configured to transition to an opaque mode, blocking transitions of signal 524 from propagating to serialized signal 518. Latch circuit 505 is further configured, in response to a deactivation of signal 520, to transition to a transparent mode allowing transitions of signal 524 to propagate to serialized signal 518.

Logic gate 508 is configured to generate signal 521 using output signal 515 and serialized signal 518. To generate signal 521, logic gate 508 is further configured, in response to a determination that output signal 515 and serialized signal 518 have the same logic value, to activate signal 521. It is noted that logic gate 508 employs serialized signal 518 is to avoid glitches in serialized signals 517 and 518, and/or to avoid a serializer circuit 500 entering a metastable state when asynchronous signals 510, 511, and 512 all switch within a short period of time of each other. In cases where such glitches and metastability are not a concern, logic gate 508 can use signal 524 and an output signal corresponding to asynchronous signal 512 to generate signal 521.

In response to the activation of signal 521, latch circuit 504 is configured to transition to an opaque mode, blocking transitions of signal 523 from propagating to serialized signal 517. Latch circuit 504 is further configured, in response to a deactivation of signal 521, to transition to a transparent mode allowing transitions of signal 523 to propagate to serialized signal 517.

Logic gate 509 is configured to generate signal 522 using signals 520 and 521. To generate signal 522, logic gate 509 is further configured to activate signal 522 in response to a determination that signals 520 and 521 both have a logic-1 value.

In response to the activation of signal 522, latch circuit 501 is configured to transition to an opaque mode, blocking transitions of asynchronous signal 510 from propagating to serialized signal 516. Latch circuit 501 is further configured, in response to a deactivation of signal 522, to transition to a transparent mode allowing transitions of asynchronous signal 510 to propagate to serialized signal 516.

A transition of asynchronous signal 510 will block transitions of asynchronous signals 511 and 512. In a similar fashion, a transition of either, or both, of asynchronous signals 511 or 512 will block transitions of asynchronous signal 510. Additionally, a transition of one of asynchronous signals 511 and 512 will block transitions of the other one of asynchronous signals 511 and 512.

In various embodiments, latch circuits 501-505 may be implemented using any suitable combination of logic gates (e.g., NAND gates, NOR gates, and the like). Alternatively, or additionally, latch circuits 501-505 may be implemented using any suitable combination of MOSFETs, FinFETs, GAAFETs, or any other suitable transconductance devices.

In various embodiments, logic gates 506-508 are configured to perform an exclusive-OR operation to generate signals 519-521, respectively. Logic gates 506-508 may be implemented using any suitable combination of transistors and combinatorial logic gates configured to implement the exclusive-OR logic function. Logic gate 509 is configured to perform an AND operation to generate signal 522. In various embodiments, logic gate 509 may be implemented using any suitable combination of transistors or combinatorial logic gates configured to implement the AND logic function.

Figure 6:
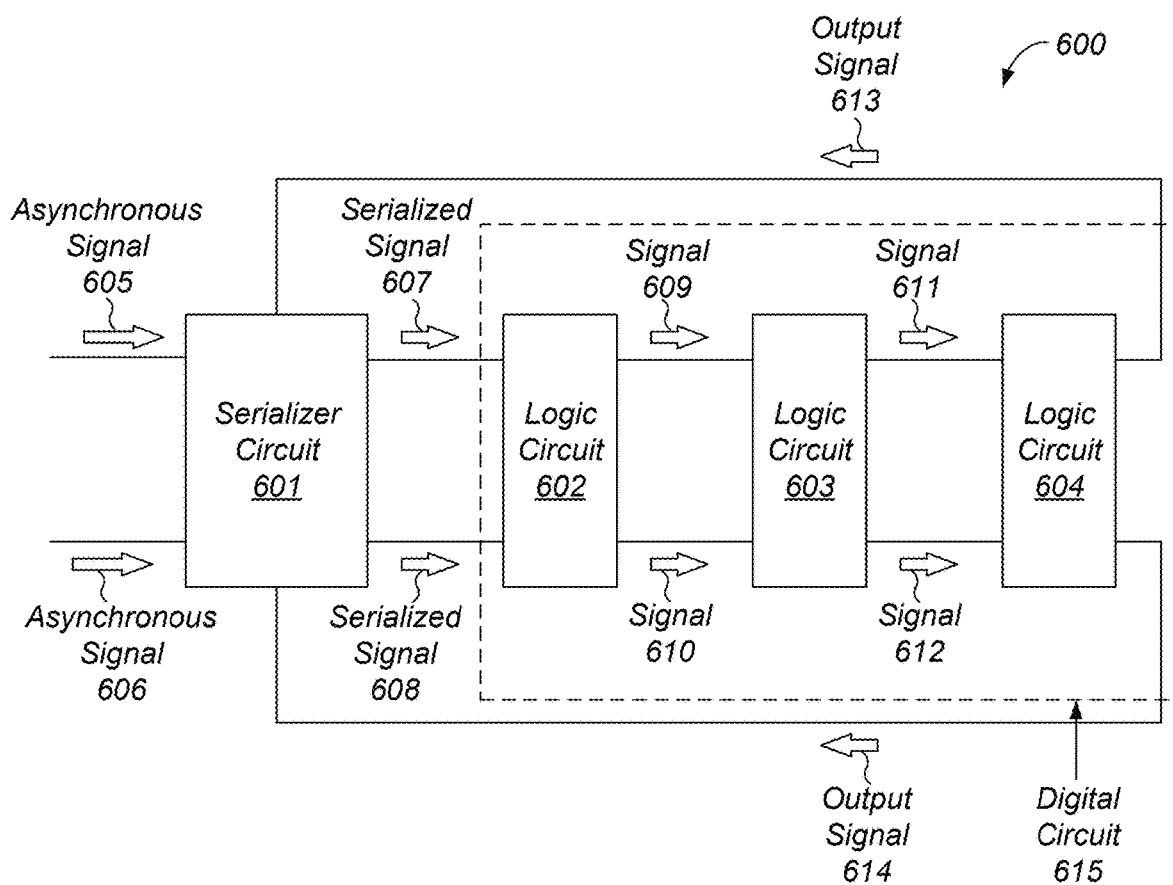
FIG. 6 is a block diagram depicting an embodiment of a serialization subsystem that is arranged in a daisy chain fashion.

Turning to FIG. 6, a block diagram of a serialization subsystem that is arranged in a daisy chain fashion is depicted. As illustrated, serialization subsystem 600 includes serializer circuit 601 and digital circuit 615, which includes logic circuits 602-604 coupled together in series. In some embodiments, serializer circuit 601 may correspond to serializer circuit 101 as depicted in FIG. 1, and any of logic circuits 602-604 may correspond to logic circuit 102 as depicted in FIG. 1. It is noted that the output of logic circuit 604, namely output signals 613 and 614, are coupled back to serializer circuit 601 in a configuration referred to as a "daisy chain."

Serializer circuit 601 is configured to receive asynchronous signals 605 and 606, and output signals 613 and 614. Although serializer circuit 601 is depicted as receiving only two asynchronous signals, and two output signals from logic circuits 602-604, in other embodiments, serializer circuit 601 may be configured to receive any suitable number of asynchronous and output signals.

As described above serializer circuit 601 is configured to generate serialized signals 607 and 608 using asynchronous signals 605 and 606 in addition to output signals 613 and 614. By using output signals 613 and 614, serializer circuit 601 may, in various embodiments, limit transitions of asynchronous signals 605 and 606 from entering digital circuit 615 until previous transitions of asynchronous signals 605 and 606 have propagated far enough through logic circuits 602-604 so that data is not corrupted.

Logic circuit 602 is configured to generate signal 609 using serialized signal 607, and generate signal 610 using serialized signal 608. In a similar fashion, logic circuit 603 is configured to generate signal 611 using signal 609, and generate signal 612 using signal 610. Logic circuit 604 is configured to generate output signal 613 using signal 611, and generate output signal 614 using signal 612. It is noted that although each of logic circuits 602-604 are depicted as receiving two signals and generating two signals, in other embodiments, logic circuits 602-604 may be configured to receive and generate any suitable number of signals based on a number of asynchronous signals received by serializer circuit 601.

In some cases, serializing asynchronous signals, as described above, can introduce problems in a computer system resulting from the asynchronous signals not being processed as fast as they are being generated. Failing to process the asynchronous signals in a timely fashion can result in loss of data that could result in system failure. One solution to this problem is to adjust the performance level of a serialization subsystem and/or the source of the asynchronous signals.

Figure 7:
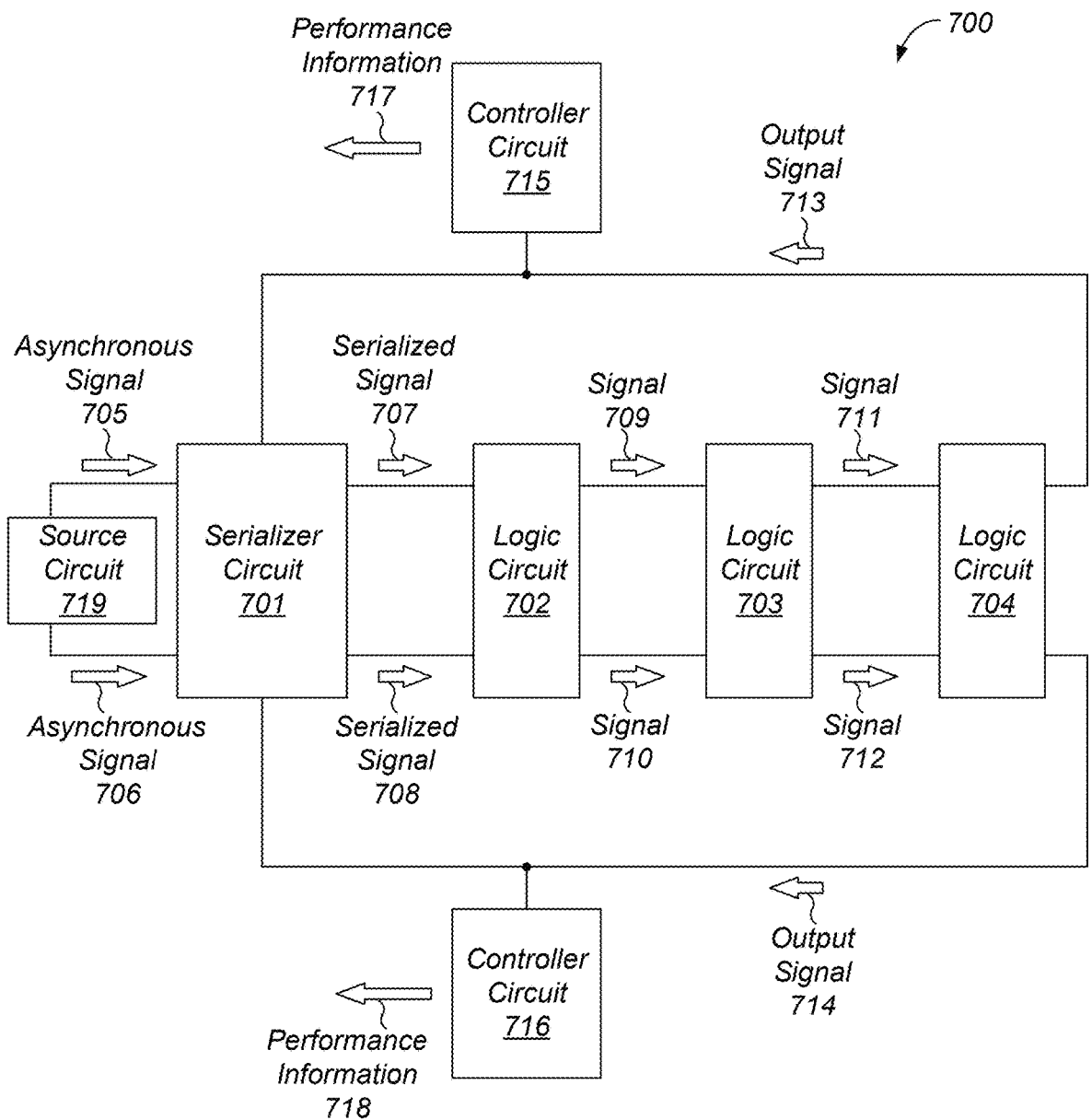
FIG. 7 is a block diagram depicting an embodiment of a serialization subsystem that includes controller circuits for monitoring data moving through the daisy chain.

A serialization subsystem that includes monitoring circuits configured to determine how quickly asynchronous signals are being processed is depicted in FIG. 7. As illustrated, serialization subsystem 700 includes serializer circuit 701, logic circuits 702-704, controller circuits 715 and 716, and source circuit 719. In various embodiments, serializer circuit 701 may correspond to serializer circuit 101 as depicted in FIG. 1, and any of logic circuits 702-704 may correspond to logic circuit 102 as depicted in FIG. 1.

Serializer circuit 701 and logic circuits 702-704 are coupled together in a daisy chain fashion. Controller circuits 715 and 716 are coupled to corresponding outputs of logic circuit 704. Although serializer subsystem 700 is depicted as processing two asynchronous signals, in other embodiments, serializer subsystem 700 may be configured to process any suitable number of asynchronous signals.

Source circuit 719 is configured to generate asynchronous signals 705 and 706. In a fashion similar to that described above, serializer circuit 701 is configured to generate serialized signals 707 and 708 using asynchronous signals 705 and 706 in addition to output signals 713 and 714.

Logic circuit 702 is configured to generate signals 709 and 710 using serialized signals 707 and 708, respectively, while logic circuit 703 is configured to generate signals 711 and 712 using signals 709 and 710, respectively. In a similar fashion, logic circuit 704 is configured to generate output signals 713 and 714 using signals 711 and 712, respectively.

Controller circuit 715 is configured to generate performance information 717 based on output signal 713. In a similar fashion, controller circuit 716 is configured to generate performance information 718 based on output signal 714. In some cases, controller circuits 715 and 716 may generate performance information 717 and 718, respectively, to increase the performance of serializer circuit 701 and logic circuits 702-704 in response to a determination that asynchronous signals 705 and 706 are not being processed in a timely manner. Alternatively, or additionally, controller circuits 715 and 716 may generate performance information 717 and 718, respectively, to decrease the performance of source circuit 719 in response to a determination that asynchronous signals 705 and 706 are being processed too quickly by serializer circuit 701 and logic circuits 702-704.

In some cases, controller circuits 715 and 716 may be configured to generate performance information 717 and 718, respectively, to decrease the performance of serializer circuit 701 and logic circuits 702-704 in response to a determination that power consumption of serializer subsystem 700 has exceeded a threshold value.

In various embodiments, performance information 717 and performance information 718 may include data indicative of a power supply voltage level, a frequency of a clock signal, or any other suitable data relating to a power state of serializer circuit 701, logic circuits 702-704, and source circuit 719. By adjusting the power supply voltage level, the frequency of the clock signal, and the like, the speed with which serializer circuit 701, logic circuits 702-704, and source circuit 719 function can be adjusted.

Controller circuits 715 and 716 may be implemented using any suitable processor cores or microcontroller circuits. In some cases, controller circuits 715 and 716 may be included as part of a power management controller circuit.

Figure 8:
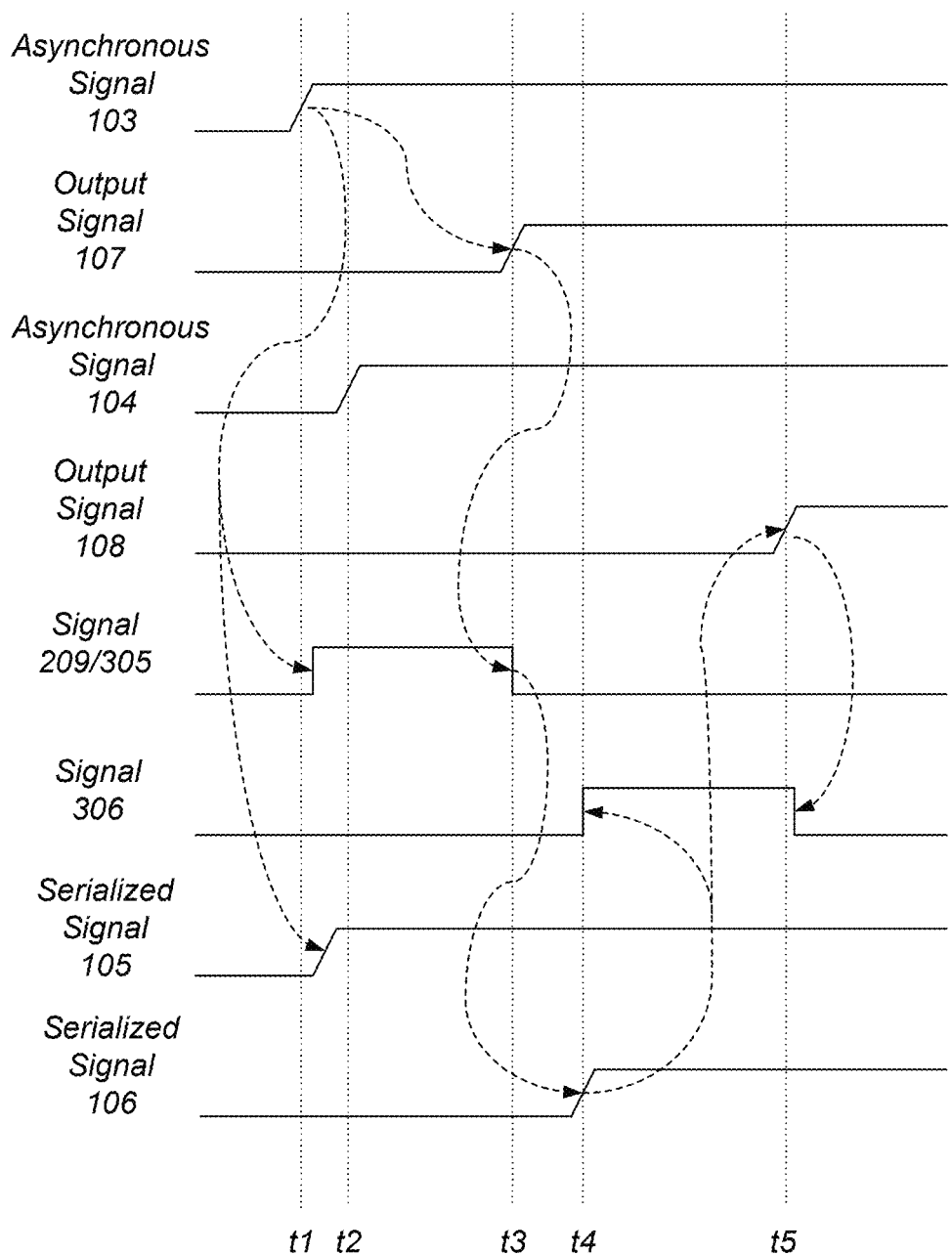
FIG. 8 depicts example waveforms associated with the operation of a serializer circuit.

Referring now to FIG. 8, example waveforms associated with the operation of a serializer circuit are depicted. It is noted that the waveforms of FIG. 8 are merely examples and that, in other embodiments, the waveforms may have different relative timings to each other. Although the waveforms of FIG. 8 are described in relation to the embodiment of serializer circuit 300 depicted in FIG. 3, similar waveforms can be used to describe the operation of the embodiment of serializer circuit 200 depicted in FIG. 2.

At time t1, asynchronous signal 103 transitions from a logic-0 value to a logic-1 value. As indicated, this transition triggers a corresponding transition on serialized signal 105 after a short delay corresponding to a delay through latch circuit 301. Additionally, the transition of asynchronous signal 103 results in signal 305 becoming active as indicated.

At time t2, asynchronous signal 104 transitions from a logic-0 value to a logic-1 value. Since signal 305 has already been activated, latch circuit 302 is in an opaque mode, and the transition of asynchronous signal 104 is blocked from generating a corresponding transition on serialized signal 106.

At time t3, output signal 107 transitions from a logic-0 value to a logic-1 value in response to the transition of asynchronous signal 103 that occurred at time t1. In various embodiments, the delay between time t1 and time t3 may correspond to a delay through one or more logic circuits (e.g., logic circuits 602-604).

As indicated, the transition of output signal 107 at time t3 causes signal 305 to become inactive resulting in latch circuit 302 to switch from an opaque mode to a transparent mode. With latch circuit 302 in a transparent mode, the logic-1 value of asynchronous signal 104 is allowed to propagate to serialized signal 106 at time t4. The transition to a logic-1 value of serialized signal 106 results in an activation of signals 306, which prevents any transitions of asynchronous signal 103 from propagating to serialized signal 105.

Additionally, the transition to a logic-1 value of serialized signal 106 triggers a transition of output signal 108 from a logic-0 value to a logic-1 value at time t5. In various embodiments, the time period between time t4 and time t5 may correspond to a delay through one or more logic circuits (e.g., logic circuits 602-604). With the transition of output signal 108 to a logic-1 value, signal 306 is deactivated, and the serializer circuit is ready to process a new transition on either of asynchronous signals 103 or 104.

It is noted that although the waveforms depicted in FIG. 8 illustrate transitions of the asynchronous signals from logic-0 values to logic-1 values, the operation of serializer circuit 300 is similar for transitions of the asynchronous signals from logic-1 values to logic-0 values.

To summarize, various embodiments of a serializer circuit are disclosed. Broadly speaking, a serializer circuit may be configured to receive a first asynchronous signal and a second asynchronous signal. The serializer circuit may be further configured to generate a first serialized signal by blocking transitions of the first asynchronous signal in response to a detection of a transition of the second asynchronous signal. The serializer circuit may also be configured to generate a second serialized signal by blocking transitions of the second asynchronous signal in response to a detection of a transition of the first asynchronous signal. In some cases, a digital circuit may be configured to generate a first output signal using the first serialized signal, and generate a second output signal using the second serialized signal.

Figure 9:
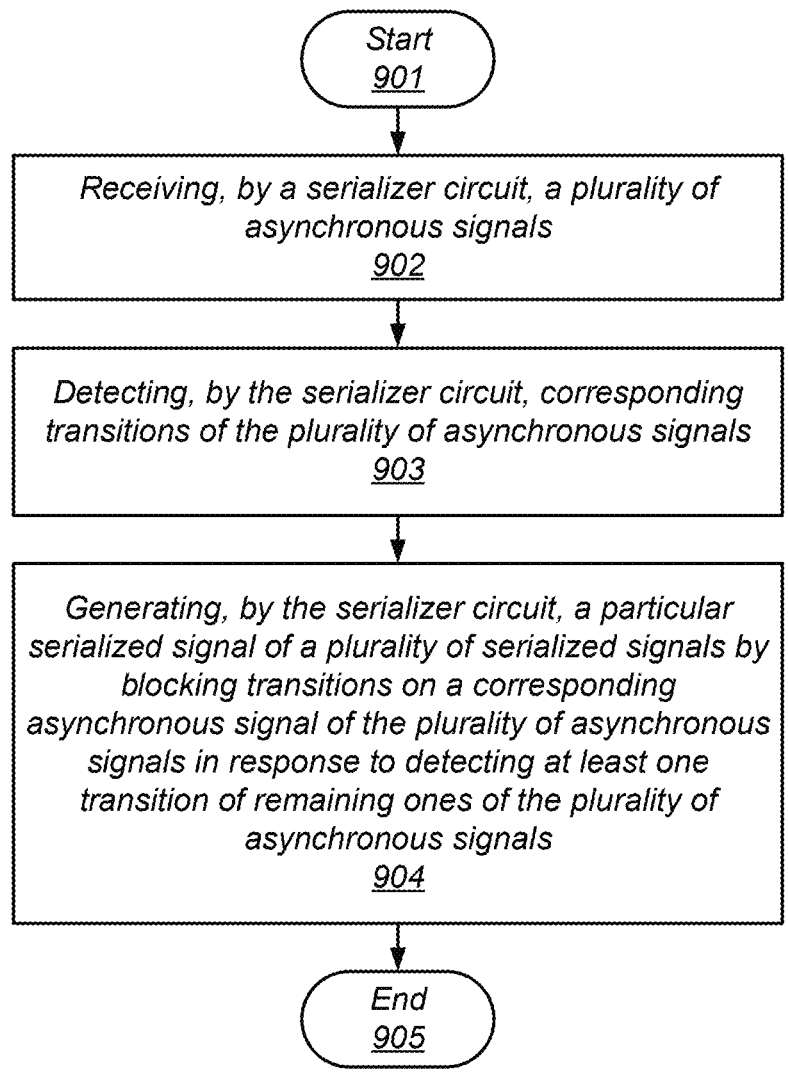
FIG. 9 is a flow diagram depicting an embodiment of a method for operating a serialization subsystem.

Turning now to FIG. 9, a flow diagram depicting an embodiment of a method for operating a serializer circuit is illustrated. The method, which may be applied to various serializer circuits, e.g., serializer circuit 101 as depicted in FIG. 1, begins in block 901.

The method includes receiving, by a serializer circuit, a plurality of asynchronous signals (block 902). In various embodiments, the plurality of asynchronous signals may correspond to multiple bits of a data and/or control signal bus. In some embodiments, the method may further include generating, by a source circuit, the plurality of asynchronous signal, and transmitting, by the source circuit, the plurality of asynchronous signal without a related timing signal to the serializer circuit.

The method further includes detecting, by the serializer circuit, corresponding transitions of the plurality of asynchronous signals (block 903). In some embodiments, detecting, by the serializer circuit, corresponding transitions of the plurality of asynchronous signals may include comparing a current value of a given asynchronous signal of the plurality of asynchronous signals to a previously sampled value of the given asynchronous signal.

The method also includes generating, by the serializer circuit, a particular serialized signal of a plurality of serialized signals by blocking transitions on a corresponding asynchronous signal of the plurality of asynchronous signals in response to detecting at least one transition of remaining ones of the plurality of asynchronous signals (block 904). In some embodiments, generating the particular serialized signal includes blocking, by the serializer circuit, the transitions of the corresponding asynchronous signals using a combination of the at least one remaining asynchronous signal of the remaining asynchronous signals and a delayed version of the at least one remaining asynchronous signal.

In various embodiments, blocking the transitions of the corresponding asynchronous signals includes performing, by the serializer circuit, an exclusive-OR operation using the at least one remaining asynchronous signal and the delayed version of the at least one remaining asynchronous signal. In some embodiments, blocking the transitions of the corresponding asynchronous signal may additionally include generating, by the serializer circuit, a latch control signal based on a result of the exclusive-OR operation, and sampling, by a latch circuit included in the serializer circuit, a value of the corresponding asynchronous signal using the latch control signal.

In other embodiments, the method may include generating, by a digital circuit, a plurality of output signals using the plurality of serialized signals. In such cases, generating the particular serialized signal includes blocking, by the serializer circuit, the transitions of the corresponding asynchronous signal using a combination of the at least one remaining asynchronous signal of the remaining asynchronous signals and a corresponding output signal of the plurality of output signals.

In some embodiments, blocking the transitions of the corresponding asynchronous signal includes performing, by the serializer circuit, an exclusive-OR operation using the at least one remaining asynchronous signal and the corresponding output signal of the plurality of output signals. In such cases, the method may further include generating, by the serializer circuit, a latch control signal based on a result of the exclusive-OR operation, and sampling, by a latch circuit included in the serializer circuit, a value of the corresponding asynchronous signal using the latch control signal.

In other embodiments, the digital circuit includes a plurality of logic circuits coupled together in a serial fashion. In such cases, the method may further include monitoring a number of transitions of at least one of the plurality of output signals, and adjusting a performance level of the digital circuit based on the number of transitions. In some embodiments, adjusting the performance level of the digital circuit includes changing a power state of the digital circuit.

In other embodiments, the method may include adjusting a performance level of a source circuit based on the number of transitions, wherein the source circuit is configured to generate the plurality of asynchronous signals. The method concludes in block 905.

Figure 10:
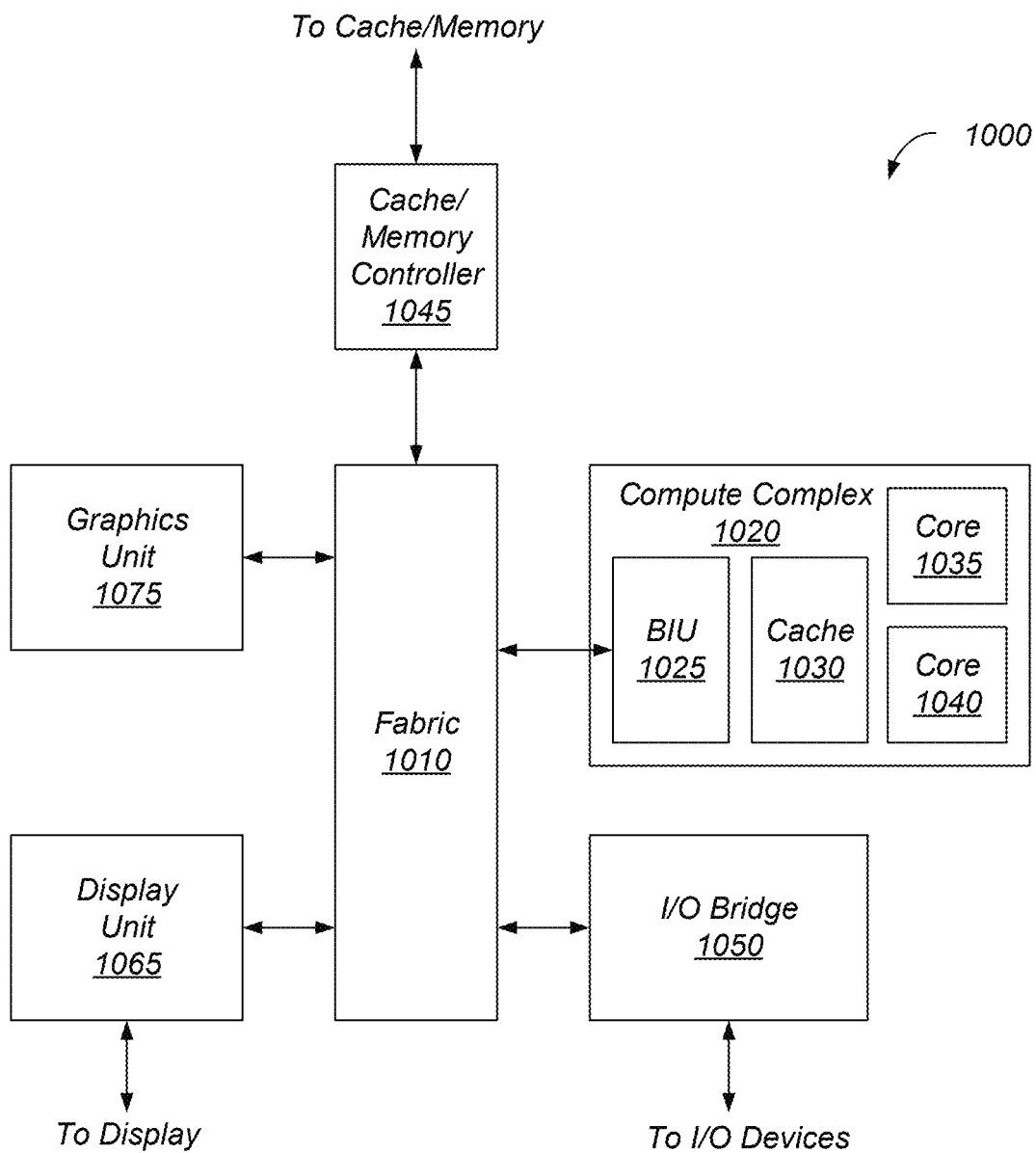
FIG. 10 is a block diagram of an embodiment of a device that includes a serializer circuit.

Referring now to FIG. 10, a block diagram illustrating an example embodiment of device 1000 is shown. In various embodiments, device 1000 may implement functionality of serializer circuit 101 as depicted in FIG. 1. In some embodiments, elements of device 1000 may be included within a system on a chip. In some embodiments, device 1000 may be included in a mobile device, which may be battery-powered. Therefore, power consumption by device 1000 may be an important design consideration. In the illustrated embodiment, device 1000 includes fabric 1010, compute complex 1020, input/output (I/O) bridge 1050, cache/memory controller 1045, graphics unit 1075, and display unit 1065. In some embodiments, device 1000 may include other components (not shown) in addition to, or in place of, the illustrated components, such as video processor encoders and decoders, image processing or recognition elements, computer vision elements, etc.

Fabric 1010 may include various interconnects, buses, MUX's, controllers, etc., and may be configured to facilitate communication between various elements of device 1000. In some embodiments, portions of fabric 1010 may be configured to implement various different communication protocols. In other embodiments, fabric 1010 may implement a single communication protocol and elements coupled to fabric 1010 may convert from the single communication protocol to other communication protocols internally.

In the illustrated embodiment, compute complex 1020 includes bus interface unit (BIU) 1025, cache 1030, and cores 1035 and 1040. In various embodiments, compute complex 1020 may include various numbers of processors, processor cores and caches. For example, compute complex 1020 may include 1, 2, or 4 processor cores, or any other suitable number. In one embodiment, cache 1030 is a set associative L2 cache. In some embodiments, cores 1035 and 1040 may include internal instruction and data caches. In some embodiments, a coherency unit (not shown) in fabric 1010, cache 1030, or elsewhere in device 1000 may be configured to maintain coherency between various caches of device 1000. BIU 1025 may be configured to manage communication between compute complex 1020 and other elements of device 1000. Processor cores such as cores 1035 and 1040 may be configured to execute instructions of a particular instruction set architecture (ISA) which may include operating system instructions and user application instructions. These instructions may be stored in a computer readable medium such as a memory coupled to memory controller 1045 discussed below.

As used herein, the term "coupled to" may indicate one or more connections between elements, and a coupling may include intervening elements. For example, in FIG. 10, graphics unit 1075 may be described as "coupled to" a memory through fabric 1010 and cache/memory controller 1045. In contrast, in the illustrated embodiment of FIG. 10, graphics unit 1075 is "directly coupled" to fabric 1010 because there are no intervening elements.

Cache/memory controller 1045 may be configured to manage transfer of data between fabric 1010 and one or more caches and memories. For example, cache/memory controller 1045 may be coupled to an L3 cache, which may, in turn, be coupled to a system memory. In other embodiments, cache/memory controller 1045 may be directly coupled to a memory. In some embodiments, cache/memory controller 1045 may include one or more internal caches. Memory coupled to cache/memory controller 1045 may be any type of volatile memory, such as dynamic random access memory (DRAM), synchronous DRAM (SDRAM), double data rate (DDR, DDR2, DDR3, etc.) SDRAM (including mobile versions of SDRAMs such as mDDR3, etc., and/or low power versions of SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to cache/memory controller 1045 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 1020 to cause the computing device to perform functionality described herein.

Graphics unit 1075 may include one or more processors, e.g., one or more graphics processing units (GPUs). Graphics unit 1075 may receive graphics-oriented instructions, such as OPENGL®, Metal®, or DIRECT3D® instructions, for example. Graphics unit 1075 may execute specialized GPU instructions or perform other operations based on the received graphics-oriented instructions. Graphics unit 1075 may generally be configured to process large blocks of data in parallel and may build images in a frame buffer for output to a display, which may be included in the device or may be a separate device. Graphics unit 1075 may include transform, lighting, triangle, and rendering engines in one or more graphics processing pipelines. Graphics unit 1075 may output pixel information for display images. Graphics unit

1075, in various embodiments, may include programmable shader circuitry which may include highly parallel execution cores configured to execute graphics programs, which may include pixel tasks, vertex tasks, and compute tasks (which may or may not be graphics-related).

Display unit 1065 may be configured to read data from a frame buffer and provide a stream of pixel values for display. Display unit 1065 may be configured as a display pipeline in some embodiments. Additionally, display unit 1065 may be configured to blend multiple frames to produce an output frame. Further, display unit 1065 may include one or more interfaces (e.g., MIPI® or embedded display port (eDP)) for coupling to a user display (e.g., a touchscreen or an external display).

I/O bridge 1050 may include various elements configured to implement: universal serial bus (USB) communications, security, audio, and low-power always-on functionality, for example. I/O bridge 1050 may also include interfaces such as pulse-width modulation (PWM), general-purpose input/output (GPIO), serial peripheral interface (SPI), and inter-integrated circuit (I2C), for example. Various types of peripherals and devices may be coupled to device 1000 via I/O bridge 1050.

In some embodiments, device 1000 includes network interface circuitry (not explicitly shown), which may be connected to fabric 1010 or I/O bridge 1050. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 1000 with connectivity to various types of other devices and networks.

Figure 11:
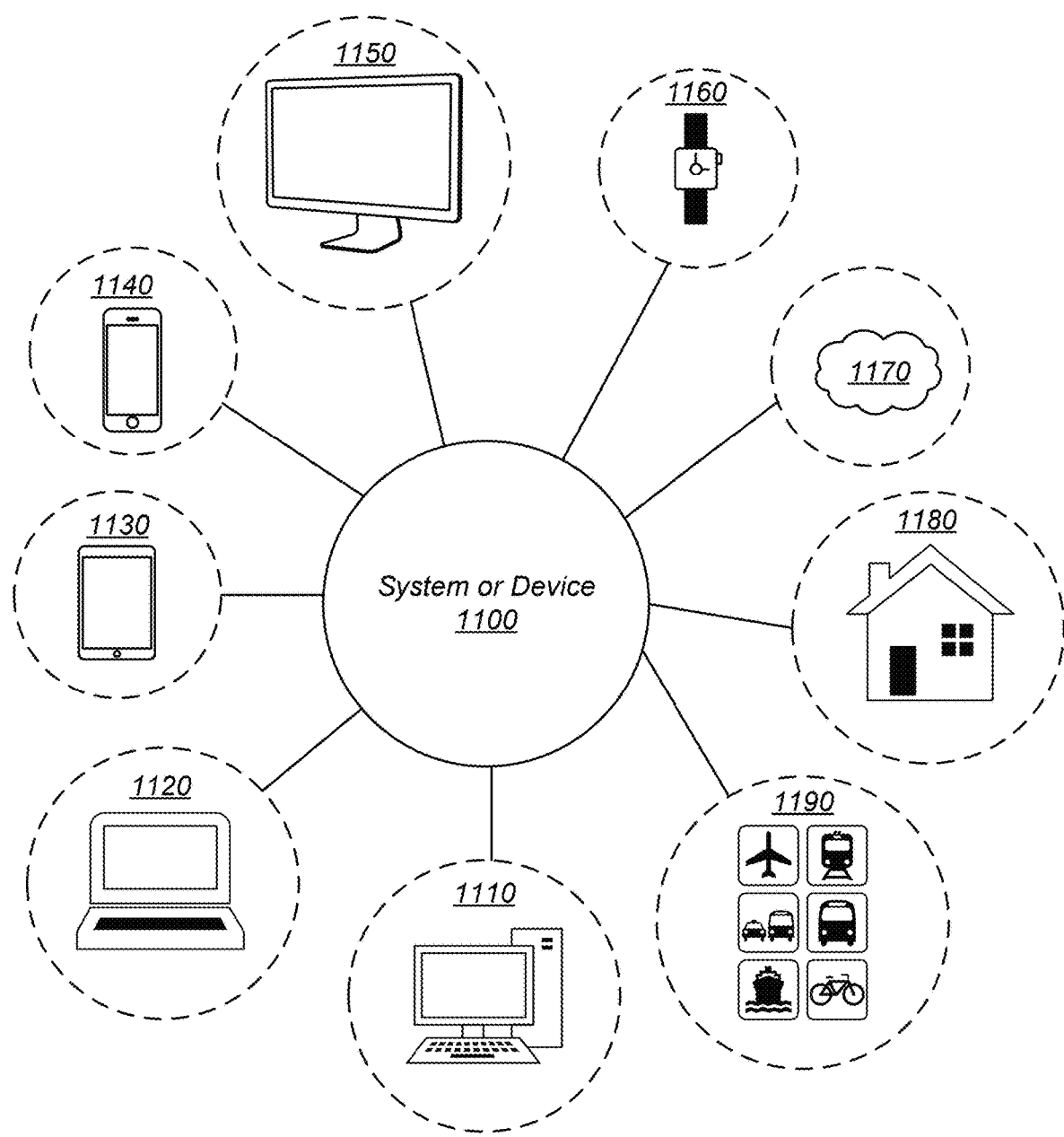
FIG. 11 is a block diagram of various embodiments of computer systems that may include power management circuits.

Turning now to FIG. 11, various types of systems that may include any of the circuits, devices, or system discussed above are illustrated. System or device 1100, which may incorporate or otherwise utilize one or more of the techniques described herein, may be utilized in a wide range of areas. For example, system or device 1100 may be utilized as part of the hardware of systems such as a desktop computer 1110, laptop computer 1120, tablet computer 1130, cellular or mobile phone 1140, or television 1150 (or set-top box coupled to a television).

Similarly, disclosed elements may be utilized in a wearable device 1160, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1100 may also be used in various other contexts. For example, system or device 1100 may be utilized in the context of a server computer system, such as a dedicated server or on shared hardware that implements a cloud-based service 1170. Still further, system or device 1100 may be implemented in a wide range of specialized everyday devices, including devices 1180 commonly found in the home such as refrigerators, thermostats, security cameras, etc. The interconnection of such devices is often referred to as the "Internet of Things" (IoT). Elements may also be implemented in various modes of transportation. For example, system or device 1100 could be employed in the control systems, guidance systems, entertainment systems, etc. of various types of vehicles 1190.

The applications illustrated in FIG. 11 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as: design simulation, design synthesis, circuit fabrication, etc.

Figure 12:
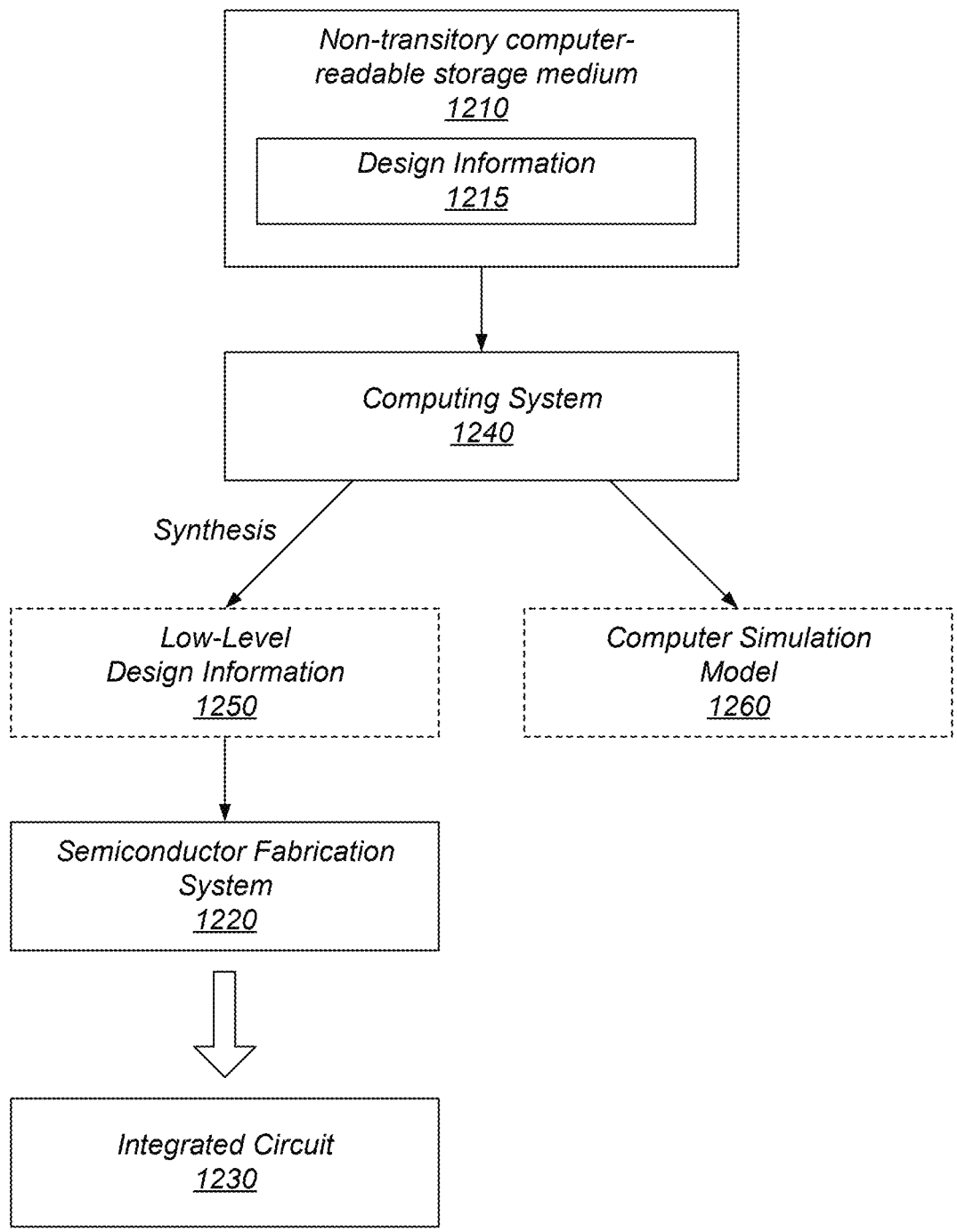
FIG. 12 illustrates an example of a non-transitory computer-readable storage medium that stores circuit design information.

FIG. 12 is a block diagram illustrating an example of a non-transitory computer-readable storage medium that stores circuit design information 1215, according to some embodiments. In the illustrated embodiment, computing system 1240 is configured to process design information 1215. This may include executing instructions included in design information 1215, interpreting instructions included in design information 1215, compiling, transforming, or otherwise updating design information 1215, etc. Therefore, design information 1215 controls computing system 1240 (e.g., by programming computing system 1240) to perform various operations discussed below, in some embodiments.

In the illustrated example, computing system 1240 processes design information 1215 to generate both computer simulation model 1250 of a hardware circuit 1260 and low-level design information 1250. In other embodiments, computing system 1240 may generate only one of these outputs, may generate other outputs based on design information 1215, or both. Regarding computer simulation model 1260, computing system 1240 may execute instructions of a hardware description language that includes register transfer level (RTL) code, behavioral code, structural code, or some combination thereof. The simulation model may perform the functionality specified by design information 1215, facilitate verification of the functional correctness of the hardware design, generate power consumption estimates, generate timing estimates, etc.

In the illustrated example, computing system 1240 also processes design information 1215 to generate low-level design information 1250 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on low-level design information 1250 (potentially among other inputs), semiconductor fabrication system 1220 is configured to fabricate integrated circuit 1230 (which may correspond to functionality of the simulation model 1260). Note that computing system 1240 may generate different simulation models based on design information at various levels of description, including low-level design information 1250, design information 1215, and so on. The data representing design information 1250 and computer simulation model 1260 may be stored on non-transitory computer readable storage medium 1210, or on one or more other media.

In some embodiments, the low-level design information 1250 controls (e.g., programs) semiconductor fabrication system 1220 to fabricate integrated circuit 1230. Thus, when processed by the fabrication system, the design information may program the fabrication system to fabricate a circuit that includes various circuitry disclosed herein.

Non-transitory computer-readable storage medium 1210 may comprise any of various appropriate types of memory devices or storage devices. Non-transitory computer-readable storage medium 1210 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1210 may include other types of non-transitory memory as well or combinations thereof. Accordingly, non-transitory computer-readable storage medium 1210 may include two or more memory media; such media may reside in different locations—for example, in different computer systems that are connected over a network.

Design information 1215 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 1240, semiconductor fabrication system 1220, or both. In some embodiments, design information 1215 may also include one or more cell libraries that specify the synthesis, layout, or both of integrated circuit 1230. In some embodiments, design information 1215 is specified in whole, or in part, in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 1230 may, in various embodiments, include one or more custom macrocells, such as memories, analog or mixed-signal circuits, and the like. In such cases, design information 1215 may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 1220 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1220 may also be configured to perform various testing of fabricated circuits for correct operation.

In various embodiments, integrated circuit 1230 and computer simulation model 1260 are configured to operate according to a circuit design specified by design information 1215, which may include performing any of the functionality described herein. For example, integrated circuit 1230 may include any of various elements shown in FIGS. 1-7. Further, integrated circuit 1230 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model does not imply that the instructions must be executed in order for the element to be met, but rather, specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by design information 1215. The different circuit implementations may affect the performance, area, power consumption, etc. of a given design (potentially with tradeoffs between different design goals), but the logical function does not vary among the different circuit implementations of the same circuit design.

In some embodiments, the instructions included in design information 1215 provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information included in low-level design information 1250. Low-level design information 1250 may program semiconductor fabrication system 1220 to fabricate integrated circuit 1230.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . W, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . W, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third," when applied to a feature, do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors, or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, a circuit, or a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112 (f) for that claim element. Should Applicant wish to invoke Section 112 (f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), a functional unit, a memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as a structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits, or portions thereof, may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:
a serializer circuit configured to:
receive a first asynchronous signal and a second asynchronous signal;
generate a first serialized signal by blocking transitions of the first asynchronous signal in response to a detection of a transition of the second asynchronous signal; and
generate a second serialized signal by blocking transitions of the second asynchronous signal in response to a detection of a transition of the first asynchronous signal; and
a digital circuit configured to:
generate a first output signal using the first serialized signal; and
generate a second output signal using the second serialized signal.

2. The apparatus of claim 1, wherein to generate the first serialized signal, the serializer circuit is further configured to block the transitions of the first asynchronous signal using a combination of the second asynchronous signal and a delayed version of the second asynchronous signal.

3. The apparatus of claim 2, wherein the serializer circuit is further configured to perform an exclusive-OR operation using the second asynchronous signal and the delayed version of the second asynchronous signal to generate the combination of the second asynchronous signal and the second output signal.

4. The apparatus of claim 1, wherein to generate the first serialized signal, the serializer circuit is further configured to block the transitions of the first asynchronous signal using a combination of the second asynchronous signal and the second output signal.

5. The apparatus of claim 4, wherein the serializer circuit is further configured to perform an exclusive-OR operation using the second asynchronous signal and the second output signal to generate the combination of the second asynchronous signal and the second output signal.

6. The apparatus of claim 1, wherein to generate the first serialized signal, the serializer circuit is further configured to:
sample, in response to the detection of the transition of the second asynchronous signal, the first asynchronous signal to generate a latched value of the first asynchronous signal; and
generate the first serialized signal using the latched value of the first asynchronous signal.

7. A method, comprising:
receiving, by a serializer circuit, a plurality of asynchronous signals;
detecting, by the serializer circuit, corresponding transitions of the plurality of asynchronous signals; and
generating, by the serializer circuit, a particular serialized signal of a plurality of serialized signals by blocking transitions of a corresponding asynchronous signal of the plurality of asynchronous signals in response to detecting at least one transition of remaining ones of the plurality of asynchronous signals.

8. The method of claim 7, wherein generating the particular serialized signal includes blocking, by the serializer circuit, the transitions on the corresponding asynchronous signal using a combination of the at least one remaining asynchronous signal of the remaining asynchronous signals and a delayed version of the at least one remaining asynchronous signal.

9. The method of claim 8, wherein blocking the transitions on the corresponding asynchronous signal includes:
performing, by the serializer circuit, an exclusive-OR operation using the at least one remaining asynchronous signal and the delayed version of the at least one remaining asynchronous signal;
generating, by the serializer circuit, a latch control signal based on a result of the exclusive-OR operation; and
sampling, by a latch circuit included in the serializer circuit, a value of the corresponding asynchronous signal using the latch control signal.

10. The method of claim 7, further comprising generating, by a digital circuit, a plurality of output signals using the plurality of serialized signals, and wherein generating the particular serialized signal includes blocking, by the serializer circuit, the transitions on the corresponding asynchronous signal using a combination of the at least one remaining asynchronous signal of the remaining asynchronous signals and a corresponding output signal of the plurality of output signals.

11. The method of claim 10, wherein blocking the transitions on the corresponding asynchronous signal includes:
performing, by the serializer circuit, an exclusive-OR operation using the at least one remaining asynchronous signal and the corresponding output signal of the plurality of output signals;

generating, by the serializer circuit, a latch control signal based on a result of the exclusive-OR operation; and sampling, by a latch circuit included in the serializer circuit, a value of the corresponding asynchronous signal using the latch control signal.

12. The method of claim 10, wherein the digital circuit includes a plurality of logic circuits coupled together in a serial fashion, and further comprising:

monitoring a number of transitions of at least one of the plurality of output signals; and adjusting a performance level of the digital circuit based on the number of transitions.

13. The method of claim 12, wherein adjusting the performance level includes changing a power state of the digital circuit.

14. An apparatus, comprising:

a plurality of digital circuits coupled together in a serial fashion, wherein the plurality of digital circuits is configured to:

generate a first output signal using a first serialized signal; and generate a second output signal using a second serialized signal; and a serializer circuit configured to:

receive a first asynchronous signal and a second asynchronous signal;

generate the first serialized signal by blocking transitions on the first asynchronous signal using the second asynchronous signal and the second output signal; and generate the second serialized signal by blocking transitions on the second asynchronous signal using the first asynchronous signal and the first output signal.

15. The apparatus of claim 14, further comprising a first controller circuit configured to:

monitor a first number of transitions of the first output signal; and adjust a performance level of the plurality of digital circuits based on the first number of transitions.

16. The apparatus of claim 15, further comprising a second controller circuit configured to:

monitor a second number of transitions of the second output signal; and adjust the performance level of the plurality of digital circuits based on the second number of transitions.

17. The apparatus of claim 15, wherein to adjust the performance level of the plurality of digital circuits, the first controller circuit is further configured to change a power state of the plurality of digital circuits.

18. The apparatus of claim 14, wherein to generate the first serialized signal, the serializer circuit is further configured to block the transitions of the first asynchronous signal using a combination of the second asynchronous signal and the second output signal.

19. The apparatus of claim 18, wherein the serializer circuit is further configured to perform an exclusive-OR operation using the second asynchronous signal and the second output signal to generate the combination of the second asynchronous signal and the second output signal.

20. The apparatus of claim 18, wherein to generate the first serialized signal, the serializer circuit is further configured to:

sample, using the combination of the second asynchronous signal and the second output signal, the first asynchronous signal to generate a latched value of the first asynchronous signal; and generate the first serialized signal using the latched value of the first asynchronous signal.

\* \* \* \* \*